(12) United States Patent  (10) Patent No.: US 7,535,552 B2
Sakino  (45) Date of Patent: May 19, 2009

(54) MOVING/GUIDING APPARATUS AND EXPOSURE APPARATUS USING THE SAME

(75) Inventor: Shigeo Sakino, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 1732 days.

(21) Appl. No.: 10/090,163

(22) Filed: Mar. 5, 2002

(65) Prior Publication Data

US 2002/0128733 A1     Sep. 12, 2002

(30) Foreign Application Priority Data

Mar. 9, 2001 (JP) .............................. 2001-066531

(51) Int. Cl.
  *G03B 27/58* (2006.01)
  *G03B 27/62* (2006.01)
  *G05G 11/00* (2006.01)

(52) U.S. Cl. .................... 355/72; 355/75; 74/490.09

(58) Field of Classification Search .................. 355/53, 355/97, 72, 75; 250/311; 33/645; 384/9, 384/12, 91, 107; 236/46 R; 74/490.09; 108/143; 248/661; 700/277, 291, 295; 198/750.7

See application file for complete search history.

(56) References Cited

U.S. PATENT DOCUMENTS

| | | | | |
|---|---|---|---|---|
| 4,744,675 | A | | 5/1988 | Sakino et al. ................. 384/12 |
| 4,854,444 | A | * | 8/1989 | Iwamoto ................... 198/750.7 |
| 5,040,431 | A | | 8/1991 | Sakino et al. ................. 74/479 |
| 6,442,858 | B1 | * | 9/2002 | Asano ........................ 33/645 |
| 6,454,177 | B1 | * | 9/2002 | Sasao et al. ............... 236/46 R |
| 6,457,864 | B1 | * | 10/2002 | Chang et al. .................... 384/9 |
| 2002/0148961 | A1 | * | 10/2002 | Nakasuji et al. ............. 250/311 |
| 2003/0025890 | A1 | * | 2/2003 | Nishinaga ..................... 355/53 |

FOREIGN PATENT DOCUMENTS

| | | |
|---|---|---|
| EP | 0 747 977 A1 | 6/1996 |
| EP | 1 211 560 A1 | 6/2002 |
| JP | 57-61436 | 4/1982 |

(Continued)

OTHER PUBLICATIONS

English Abstract of Japanese patent application No. JPA 62-088526, published on Apr. 23, 1987.
European Search Report dated Sep. 16, 2002, issued in corresponding European patent appln. No. 02 25 1570, forwarded in a communication dated Sep. 20, 2002.

(Continued)

*Primary Examiner*—Peter B Kim
(74) *Attorney, Agent, or Firm*—Fitzpatrick, Cella, Harper & Scinto

(57) ABSTRACT

A moving apparatus including a first movable body which moves in a first direction in a horizontal plane, a second movable body arranged in a location different from a location of the first movable body in a vertical direction, which moves in a second direction intersecting with the first direction in the horizontal plane, a first linear motor which moves the first movable body in the first direction, a second linear motor which moves the second movable body in the second direction, a third movable body which is moved in the first direction and is moved in the second direction, a vacuum container which puts the first, second and third movable bodies in a vacuum, driving force transmission rods, and a sealing mechanism for sealing the driving force transmission rods and the vacuum container.

8 Claims, 10 Drawing Sheets

FOREIGN PATENT DOCUMENTS

| | | |
|---|---|---|
| JP | 57-41814 | 9/1982 |
| JP | 60-23941 | 6/1985 |
| JP | 63-192864 | 8/1988 |
| JP | 6-6248 | 1/1994 |
| JP | 11-297256 | 10/1999 |

OTHER PUBLICATIONS

European Search Report dated Oct. 22, 2003, issued in corresponding European patent appln. No. 02251570.4, forwarded in a Communication dated Oct. 31, 2003.

* cited by examiner

FIG. 8

```
URL  http://www.maintain.co.jp/db/input.html

TROUBLE DB INPUT WINDOW

OCCURRENCE DATE    2000/3/15  ~1404
TYPE OF APPARATUS  *********  ~1401
OBJECT    OPERATION ERROR (START-UP ERROR)  ~1403
DEVICE S/N   465NS4580001  ~1402
DEGREE OF URGENCY  D  ~1405
SYMPTOM   LED KEEPS FLICKERING
          AFTER POWER ON                    ~1406

REMEDY    POWER ON AGAIN
          (PRESS RED BUTTON IN ACTIVATION)  ~1407

PROGRESS  INTERIM HAS BEEN DONE             ~1408

[SEND] [RESET]    1410            1411            1412
LINK TO RESULT LIST DATABASE  SOFTWARE LIBRARY  OPERATION GUIDE
```

SEMICONDUCTOR DEVICE MANUFACTURING FLOW

WAFER PROCESS

MOVING/GUIDING APPARATUS AND EXPOSURE APPARATUS USING THE SAME

This application claims the benefit of Japanese Patent Application No. 2001-066531, filed Mar. 9, 2001, which is hereby incorporated by reference herein in its entirety.

FIELD OF THE INVENTION

The present invention relates to a moving/guiding apparatus for guiding a movable body, e.g., an electron beam drawing apparatus or a precision measurement instrument, which repeats high-speed movement and precision positioning, or moves by scanning at high precision in a non-atmospheric atmosphere, and an exposure apparatus, and the like, using the same.

BACKGROUND OF THE INVENTION

Generally, as disclosed in, e.g., Japanese Patent Publication No. 57-41814 and Japanese Patent Laid-Open No. 57-61436, in a moving/guiding apparatus, one shaft is directly connected to a motor (plus a transmission mechanism, such as a screw), and another shaft fixes the motor, and a force is transmitted through a coupling, so that a stage can move within the X-Y plane. For example, the Y stage is directly connected to the feed screw of a fixed motor, and is driven in the Y direction by rotation of the feed screw. An X stage is also driven in the X direction by the feed screw of the fixed motor. Since the X stage is set on the Y stage and moves in the Y direction as well, together with the Y stage, it cannot be directly connected to the feed screw of the motor fixed outside the stage, and a driving force in the X direction is supplied to it through a coupling. In this arrangement, a driving transmission shaft (e.g., a screw) and a motor are fixed (immobile) to each of the two shafts. This is suitable to transmit a force from outside a vacuum container. This arrangement, however, has the following drawbacks.

(1) The rigidity of the coupling is serially applied to the driving system to cause degradation in rigidity.

(2) Since the coupling rigidity changes depending on the position of the stage, the control characteristics change, and a sufficiently high precision and moving speed cannot be obtained.

(3) When the stage moves, an eccentric load is generated on the Y stage to deform it. Accordingly, the static posture precision (pitching) of the X stage is degraded.

(4) When the stage moves, the position of a barycenter of the system within the plane changes. Hence, when the stage is driven, oscillation, such as pitching or yawing, is induced. This also degrades the dynamic posture precision.

To cover the drawbacks of the above arrangement, a stage arrangement disclosed in Japanese Patent Publication No. 60-23941 is proposed. Even in this stage arrangement, the above items (3) and (4) are not improved. Moreover, this stage arrangement contributes little to the thrust of the coil of the driving linear motor. Therefore, the linear motor has a poor efficiency, and a large adverse influence is imposed by, e.g., heat generation.

SUMMARY OF THE INVENTION

The present invention has been made to cover the above drawbacks. It is the first object of the present invention to provide a moving/guiding apparatus capable of guiding and driving a high-precision movable body movable within the X-Y plane, and a moving/guiding method. It is the second object of the present invention to improve the seal structure of a vacuum container for storing the movable body. It is the third object of the present invention to provide a semiconductor and a liquid crystal panel manufactured by using the above moving/guiding apparatus or moving/guiding method.

It is still another object of the present invention to provide a moving/guiding apparatus, or the like, which guides movement of a movable body, e.g., an electron beam drawing apparatus or a precision measurement instrument, which repeats high-speed movement and precision positioning or moves by scanning at high precision in a non-atmospheric atmosphere.

It is still another object of the present invention to provide a moving/guiding apparatus comprising first and second movable bodies guided to move in an intersecting direction, arranged at vertically different positions, and restrained in a vertical direction, first and second actuators for driving the first and second movable bodies in the intersecting directions, and a third movable body guided to be movable on a surface plate in a moving direction of the first movable body and in a moving direction of the second movable body, and driven in two intersecting directions upon reception of forces from guide surfaces in a horizontal direction of the first and second movable bodies.

It is still another object of the present invention to provide a moving/guiding method, for a moving/guiding apparatus having first and second movable bodies guided to move in intersecting directions, arranged at vertically different positions, and restrained in a vertical direction, and a third movable body guided to be movable on a surface plate in a moving direction of the first movable body and in a moving direction of the second movable body, comprising the steps of driving the first and second movable bodies by respective actuators in directions the first and second movable bodies are guided, and driving the third movable body in two intersecting directions by forces from guide surfaces in a horizontal direction of the first and second movable bodies.

According to one aspect of the present invention, the first movable body is guided by one radial static pressure bearing and a vertically restraining static pressure bearing. Similarly, the second movable body is also guided by one radial static pressure bearing and a vertically restraining static pressure bearing. The third movable body is guided vertically by the surface of a surface plate and horizontally by the side surfaces of the first and second movable bodies. The first to third movable bodies are accommodated in a vacuum container. The first movable body is driven by at least one linear motor fixed outside the vacuum container, and the second movable body is driven by at least one linear motor fixed outside the vacuum container. The third movable body is guided vertically by the surface of the surface plate, and horizontally by the side surfaces of the first and second movable bodies. The driving operation of the third movable body is transmitted through the horizontal guide operations of the first and second movable bodies. This arrangement produces the following operations.

(1) Because both the first and second movable bodies are directly driven, a change in rigidity (characteristics), depending on the position of the stage, can be suppressed.

(2) The third movable body is vertically guided by the surface of the surface plate. Even when the first and second movable bodies move, an eccentric load is not generated, and pitching and rolling can be maintained at high precision.

(3) The driving torque of the two actuators is appropriately distributed in accordance with the positions of the first and second movable bodies. This decreases vibration in the yawing direction and improves a dynamic posture precision.

(4) Pitching and rolling are small, since they are transmitted merely through the gap of the bearing. The dynamic posture precision is improved in this respect as well.

(5) No actuators are required for moving the third movable body within a plane.

(6) As the first and second movable bodies are horizontally guided by the side surface of one stationary guide on the surface plate, even when a temperature change occurs, the gap of the bearing does not change. A fear of damage is eliminated even when a temperature change should occur during transportation or use.

According to one aspect of the present invention, the first to third movable bodies are guided by a static pressure bearing with a labyrinth seal structure described in, e.g., Japanese Patent Laid-Open No. 63-192864 (U.S. Pat. No. 2,587,227), and the first and second movable bodies are driven by the linear motors. Hence, the following functions/effects are obtained.

(1) Since no friction exists, hissing, or the like, does not occur, and high-precision positioning can be performed.

(2) Since heat generation by a contact portion does not occur, thermal deformation, or the like, does not occur. This enables high-precision positioning.

(3) Since no dust is generated, a mechanism for collecting dust is unnecessary, leading to a simple arrangement and cost reduction.

(4) Maintenance, such as grease up, is not necessary.

Furthermore, according to one aspect of the present invention, the force is transmitted from the linear motor set outside the vacuum container through a transmission rod with a sufficiently large rigidity, and the transmission rod and vacuum container are sealed by exhausting air from a labyrinth. This leads to the following effects.

(1) Driving operation from outside the vacuum container is enabled without adversely affecting the vacuum degree.

(2) A control performance almost identical to that obtained with direct drive by a linear motor can be obtained.

(3) The seal portion is of a no-contact type and does not generate dust.

(4) Since no frictional resistance exists, high-precision positioning is enabled.

As the driving portion is set outside the vacuum container, the following advantages are obtained.

(5) The vacuum container can be downsized.

(6) As the influence of the magnetism of the linear motor can be decreased, the present invention is suitable for an apparatus, e.g., an electron beam drawing apparatus, which is apt to be easily damaged by magnetism.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 8 shows a practical example of a user interface;

DETAILED DESCRIPTION OF THE PREFERRED EMBODIMENTS

Preferred embodiments of the present invention will now be described in detail in accordance with the accompanying drawings.

First Embodiment

Figure 1:
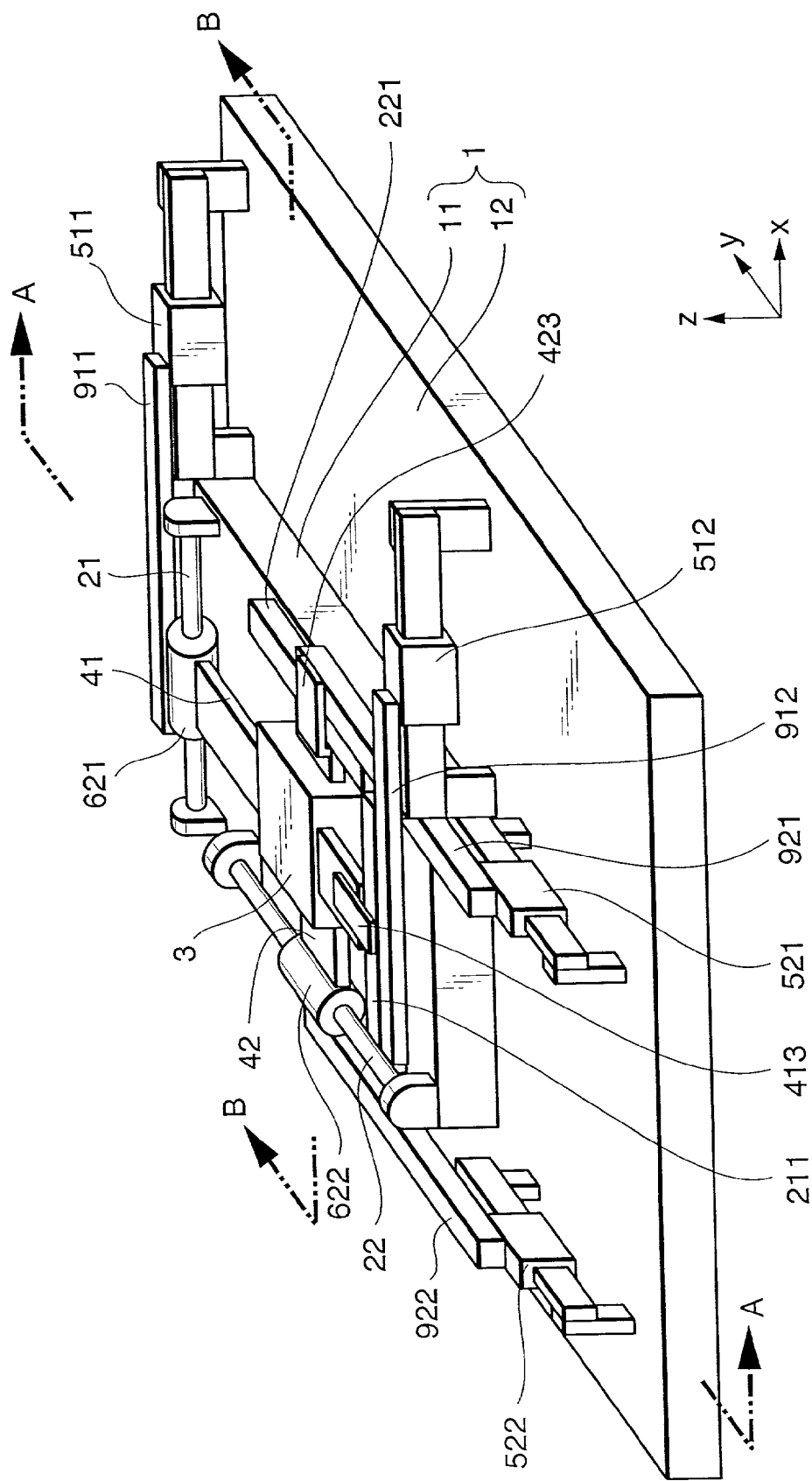
FIG. 1 is a perspective view showing the schematic arrangement of a moving/guiding apparatus according to the first embodiment of the present invention.
Figure 2:
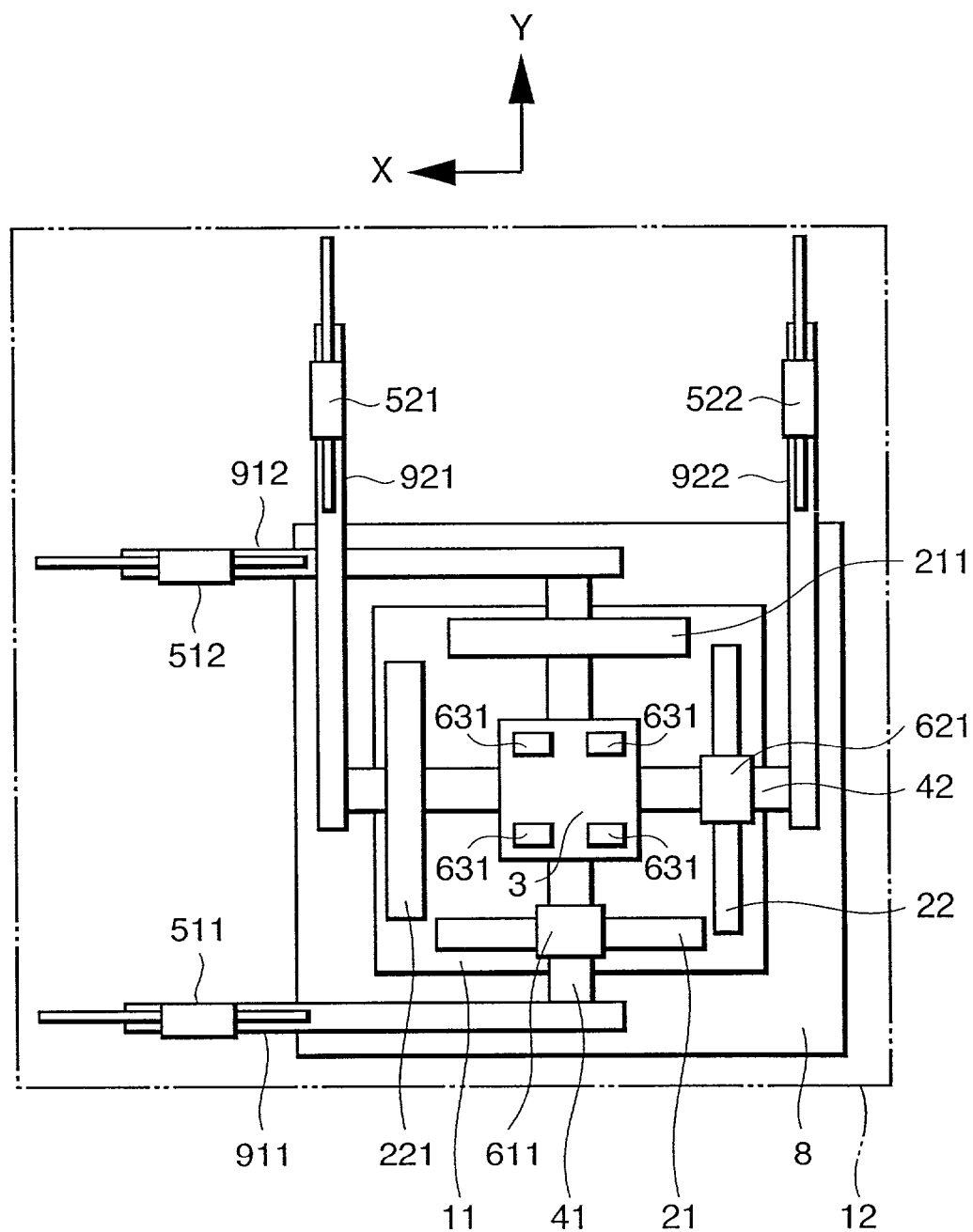
FIG. 2 is a lower surface view of the moving guiding apparatus of FIG. 1 from which a surface plate is removed.
Figure 3:
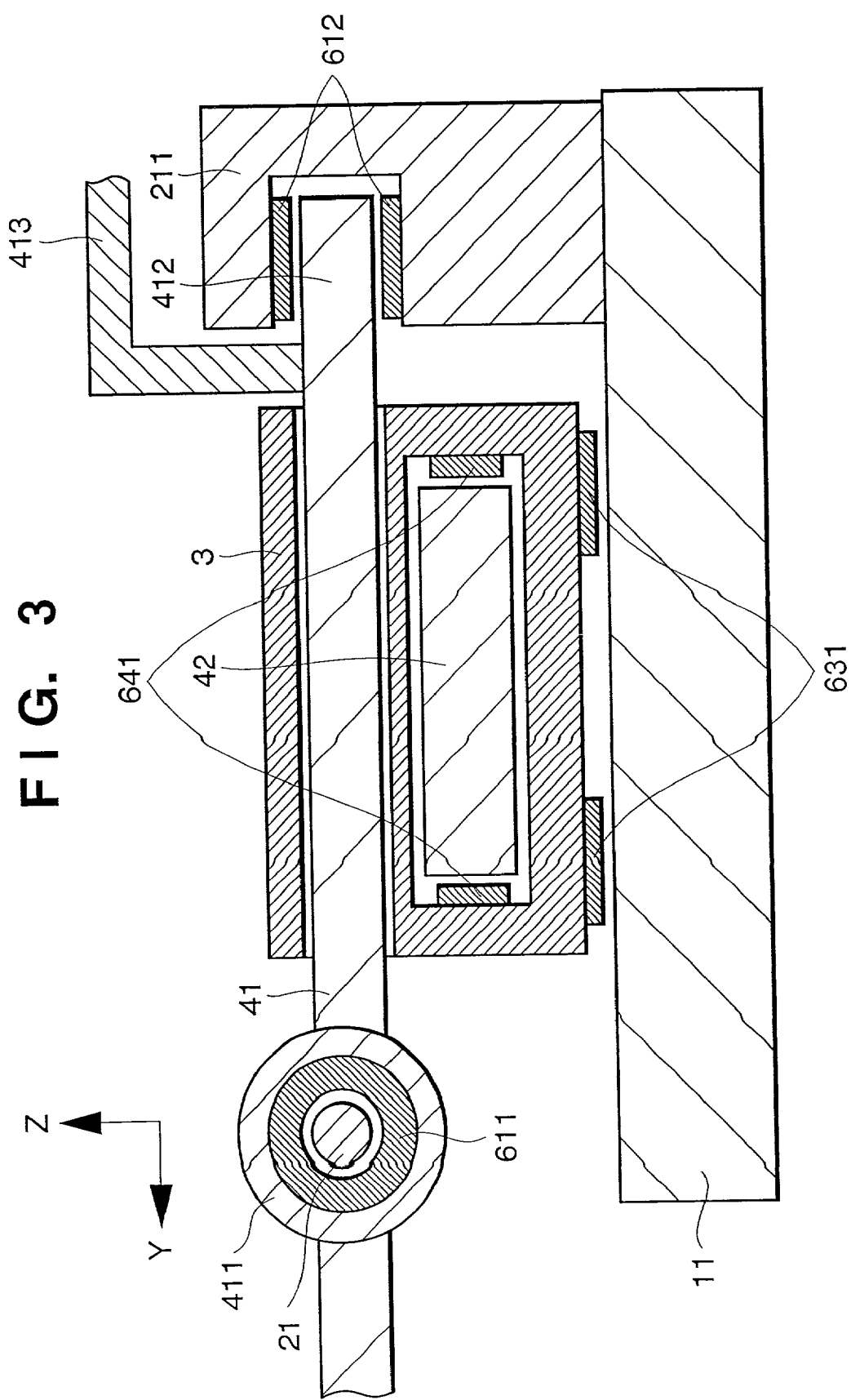
FIG. 3 is a sectional view taken along the line A-A of FIG. 1.
Figure 4:
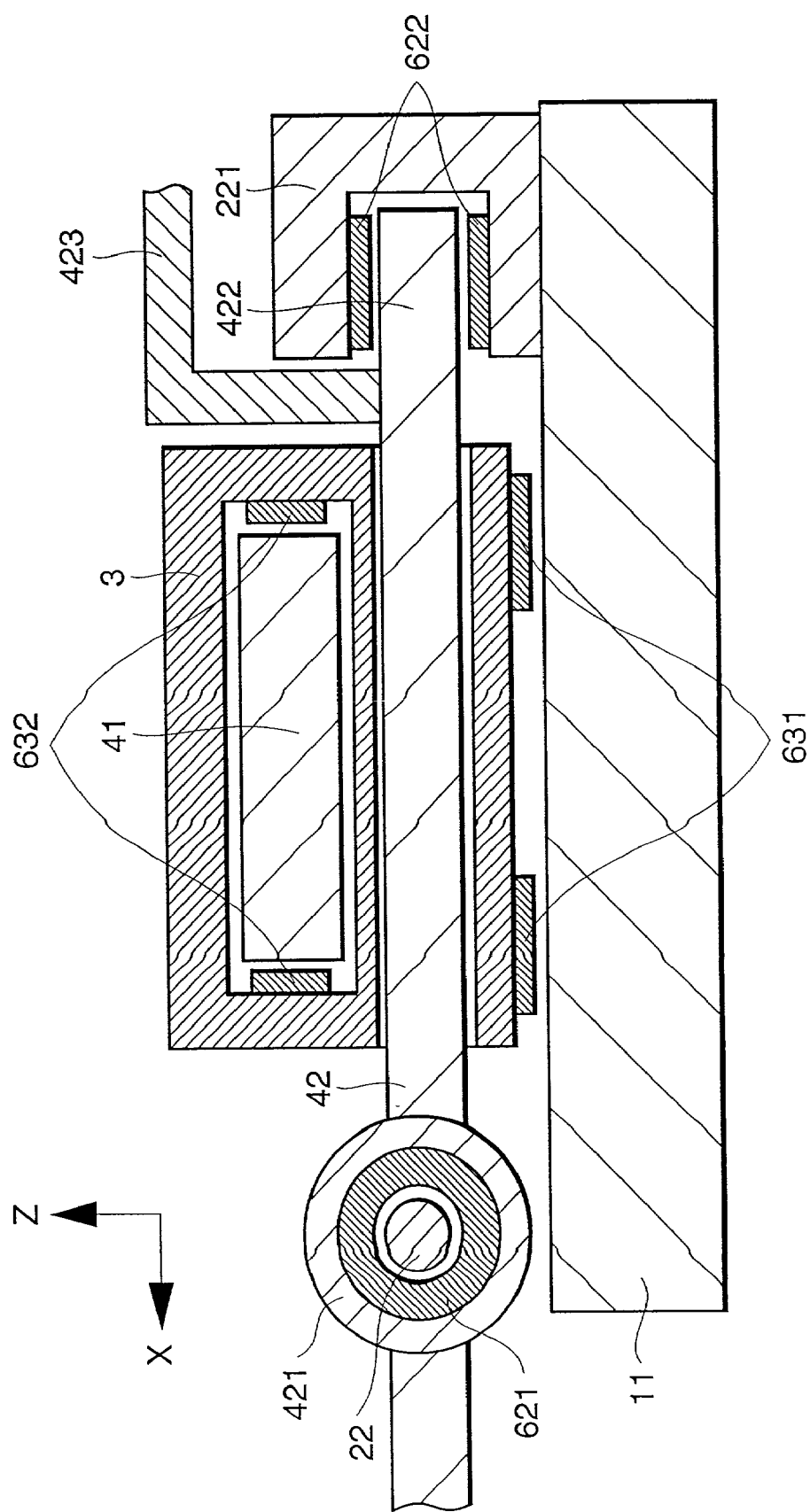
FIG. 4 is a sectional view taken along the line B-B of FIG. 1.

FIGS. 1 to 4 are schematic views showing an example of a moving/guiding apparatus according to the first embodiment of the present invention, in which FIG. 1 is a perspective view, FIG. 2 is a lower surface view of the moving/guiding apparatus of FIG. 1, from which a main body surface plate is removed, FIG. 3 is a sectional view taken along the line A-A of FIG. 1, and FIG. 4 is a sectional view taken along the line B-B of FIG. 1. In the sectional view taken along the line B-B of this embodiment, a pre-pressurizing mechanism is not used. The vacuum container (8) is shown in only FIG. 2, and is omitted in the other drawings in order to avoid complexity in the drawings.

Referring to FIGS. 1 to 4, reference numeral 1 denotes a surface plate; reference numeral 11, a stage surface plate; and reference numeral 12, a main body surface plate. Reference numeral 21 denotes an X-direction stationary guide; reference numeral 22, a Y-direction stationary guide; and reference numeral 3, an X-Y movable body movable within a plane in the X and Y directions. Reference numeral 41 denotes an X-direction movable body which can move the X-Y movable body 3 in the X direction; reference numeral 42, a Y-direction movable body in the Y direction, reference numerals 511 and 512, X-direction driving linear motors; and reference numerals 521 and 522, Y-direction driving linear motors.

Reference numeral 611 denotes a static pressure bearing (radial bearing) for guiding the X-direction movable body 41 in the X direction and restraining it in all directions except for the X direction; reference numeral 612, static pressure bearings for guiding the X-direction movable body 41 in the horizontal direction parallel to the X-Y plane and restraining it in the vertical direction; reference numeral 621, a static pressure bearing (radial bearing) for guiding the Y-direction movable body 42 in the Y direction and restraining it in all directions except for the Y direction; reference numeral 622, a static pressure bearing for guiding the Y-direction movable body 42 in the horizontal direction and restraining it in the vertical direction parallel to the Z direction; reference numeral 631, vertically restraining static pressure bearings between the X-Y movable body 3 and stage surface plate 11; reference numeral 632, static pressure bearings for guiding the X-Y movable body 3 in the Y direction while restraining horizontal (X-direction) movement between the X-Y movable body 3 and X-direction movable body 41; and reference numeral 641, static pressure bearings for guiding the X-Y movable body 3 in the X direction while restraining horizontal (Y-direction) movement between the X-Y movable body 3 and Y-direction movable body 42. These static pressure bearings use air.

Reference numeral 8 denotes the vacuum container; reference numeral 911, a driving force transmission rod for a linear motor 511; and reference numeral 912, a driving force transmission rod for a linear motor 512. The driving force transmission rods 911 and 912 transmit driving forces to the X-direction movable body 41 as X-direction transmitting rigid bodies. The driving force transmission rod 912 is connected to the X-direction movable body 41 through a connecting plate 413. Reference numerals 921 and 922 denote driving force transmission rods for linear motors 521 and 522. The driving force transmission rods 921 and 922 transmit driving forces to the Y-direction movable body 42 as Y-direction transmitting rigid bodies. The driving force transmission rod 921 is connected to the Y-direction movable body 42 through a connecting plate 423.

In the above arrangement, when air is supplied to the static pressure bearing 611, one side portion 411 of the X-direction movable body 41 floats from the X-direction stationary guide 21. When air is supplied to the static pressure bearings 612, the other portion 412 of the X-direction movable body 41 floats with respect to an X-direction guide 211 on the stage surface plate 11. Similarly, when air is supplied to the static pressure bearing 621, one side portion 421 of the Y-direction movable body 42 floats from the Y-direction stationary guide 22. When air is supplied to the static pressure bearing 622, the other side portion 422 of the Y-direction movable body 42 floats with respect to a Y-direction guide 221 on the stage surface plate 11.

When air is supplied to the static pressure bearings 631, the X-Y movable body 3 floats from the stage surface plate 11. When air is supplied to the static pressure bearings 632, the gaps between the side surface of the X-direction movable body 41 and the static pressure bearings 632 are maintained. When air is supplied to the static pressure bearings 641, the gaps between the side surface of the Y-direction movable body 42 and the static pressure bearings 641 are maintained.

As the respective static pressure bearings 611, 612, 621, 622, 631, 632, and 641 described above, static pressure bearings each with a labyrinth seal structure are preferably used. Such a static pressure bearing is described in, e.g., Japanese Patent Laid-Open No. 63-192864 (U.S. Pat. No. 2,587,227).

The above mechanism is accommodated in the vacuum container 8 shown in FIG. 2. The vacuum container 8 is set on the main body surface plate 12, and accommodates the stage surface plate 11, X-direction guides 21 and 211, Y-direction guides 22 and 221, X-Y movable body 3, X-direction movable body 41, Y-direction movable body 42, and static pressure bearings 611, 612, 621, 622, 631, 632, and 641, and the like, entirely. The driving force transmission rods 911, 912, 921, and 922 can be projected from and retracted in the vacuum container 8.

Figure 5:
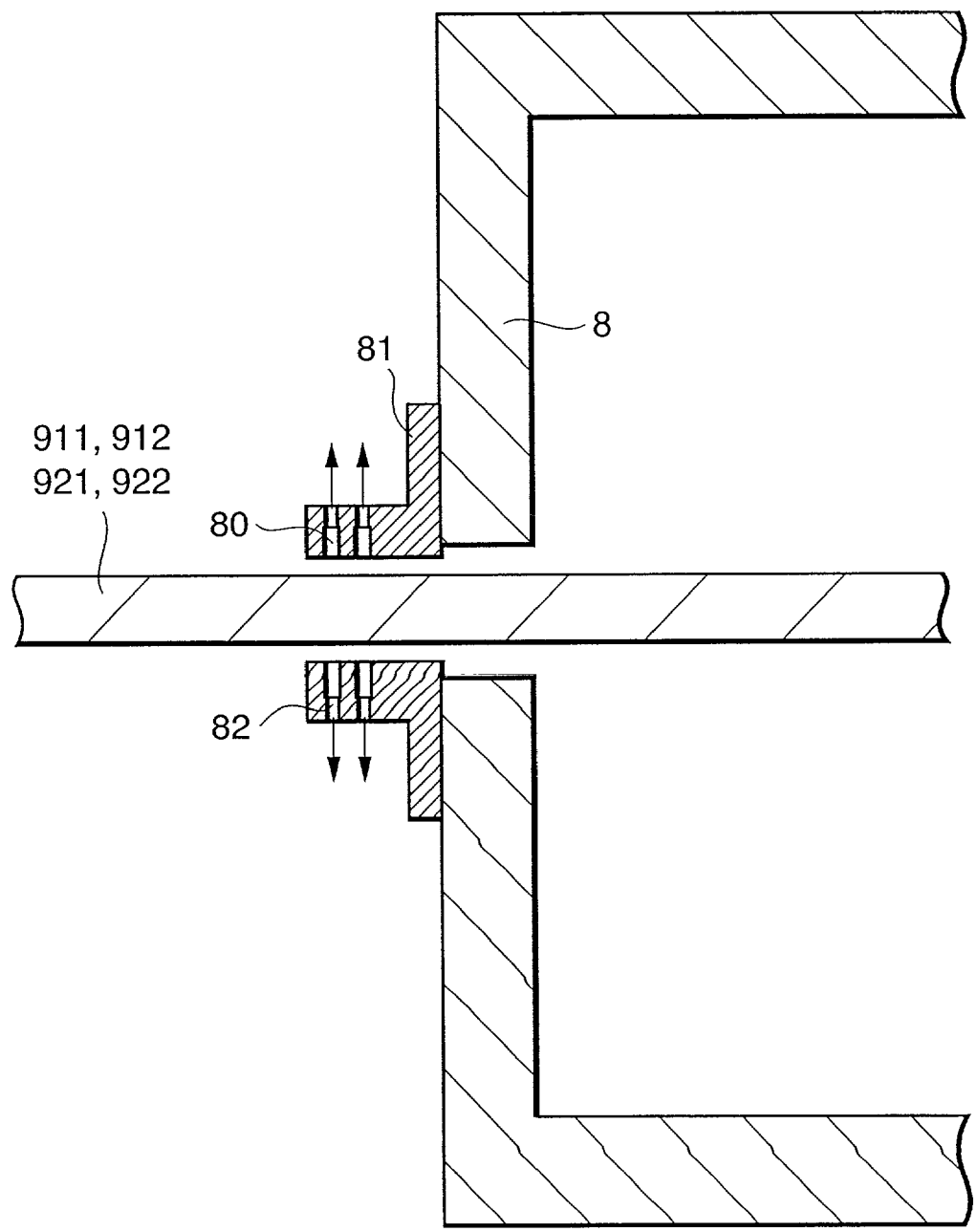
FIG. 5 is a detailed sectional view of the vacuum seal mechanism of the vacuum container shown in FIG. 2.

As shown in FIG. 5, the vacuum container 8 has labyrinth seal structures 80 at its boundaries between the inside and outside through which the driving force transmission rods 911, 912, 921, and 922 are respectively projected and retracted. In each labyrinth seal structure 80, a cylinder 81 concentrically projects from the opening of the vacuum container 8 where the driving force transmission rod 911, 912, 921, or 922 extends, and an annular groove is formed in the cylinder 81 so as to surround the corresponding driving force transmission rod, thus forming recesses and projections. This groove forms a labyrinth at that portion through which the driving force transmission rod is projected or retracted. An external gas entering the vacuum container 8 from the outside is exhausted by a vacuum pump (not shown) from the vacuum container 8 through a plurality of pores formed in the outer wall of the cylinder 81.

In this moving/guiding apparatus, when the linear motors 511 and 512 fixed on the main body surface plate 12 are driven, the X-direction movable body 41 moves in the X direction through the transmission rods 911 and 912, to move the X-Y movable body 3 in the X direction through the static pressure bearings 632. When the linear motors 521 and 522 are driven, the Y-direction movable body 42 moves in the Y direction through the transmission rods 921 and 922, to move the X-Y movable body 3 in the Y direction through the static pressure bearings 641. The transmission rods 911, 912, 921, and 922 are vacuum-sealed at the boundaries with respect to the vacuum container 8 by the respective labyrinth seal structures 80.

Although a pair of linear motors are provided in the above embodiment to each of the X- and Y-direction movable bodies 41 and 42, only one linear motor may be provided to each of the X- and Y-direction movable bodies 41 and 42. More specifically, each of the X- and Y-direction movable bodies 41 and 42 may be driven by one linear motor. An ultrasonic motor may be used as the linear motor.

The moving/guiding apparatus according the above embodiment has the following effects.

(1) Even when the position of the X-Y movable body (3) changes, no eccentric load is generated in the surface plates (1, 11, and 12). Thus, high-precision static posture can be maintained.

(2) Each of the X- and Y-direction movable bodies (41 and 42) is driven by two linear motors (511 and 512, and 521 and 522) on the surface plate (12). When the driving force is appropriately adjusted in accordance with the position of the X-Y movable body (3), the yawing vibration of the X-Y movable body (3) can be suppressed.

(3) Since all portions are of a no-contact type, dust or heat is not generated to realize high precision and easy maintenance.

(4) Since vibration is transmitted only in a very small amount through the gap of the static pressure bearing, dynamic posture precision can be maintained well.

(5) Since each of the first and second movable bodies (41 and 42) is guided in the horizontal direction parallel to the X-Y plane by the side surface of one stationary guide (21 or 22) on the stage surface plate (11), even when a temperature change occurs, the gap of the static pressure bearing does not change, and damage may not occur during transportation, or the like.

(6) The linear motors (511, 512, 521, and 522) are driven outside the vacuum container (8), and their driving forces are transmitted by the transmission rods (911, 912, 921, and 922) through the vacuum seals (80). Thus, the vacuum is little affected adversely.

(7) Even when the position of the stage changes, since no couplings, or the like, exist, the dynamic characteristics do not substantially change. This is advantageous in terms of control as well.

Second Embodiment

The second embodiment of the present invention provides an exposure apparatus using the moving/guiding apparatus described in the first embodiment. As a reticle stage or wafer stage, which mounts a reticle as an original plate or a wafer as a substrate, and moves it, the exposure apparatus uses the moving/guiding apparatus according to the present invention. A high-quality device, such as a semiconductor or liquid crystal panel, can be manufactured at a high yield by using the exposure apparatus according to this embodiment.

(Embodiment of a Semiconductor Manufacturing System)

An example of a manufacturing system for manufacturing a semiconductor device (e.g., a semiconductor chip, such as an IC or LSI, a liquid crystal panel, a CCD, a thin film magnetic head, a micromachine, and the like) by using the apparatus according to the present invention (such as the exposure apparatus described in the second embodiment) will be described. With this manufacturing system, maintenance and services, such as trouble-shooting, periodical maintenance, or providing software for a manufacturing apparatus installed at a semiconductor manufacturing factory, are performed by utilizing a computer network outside the factory.

Figure 6:
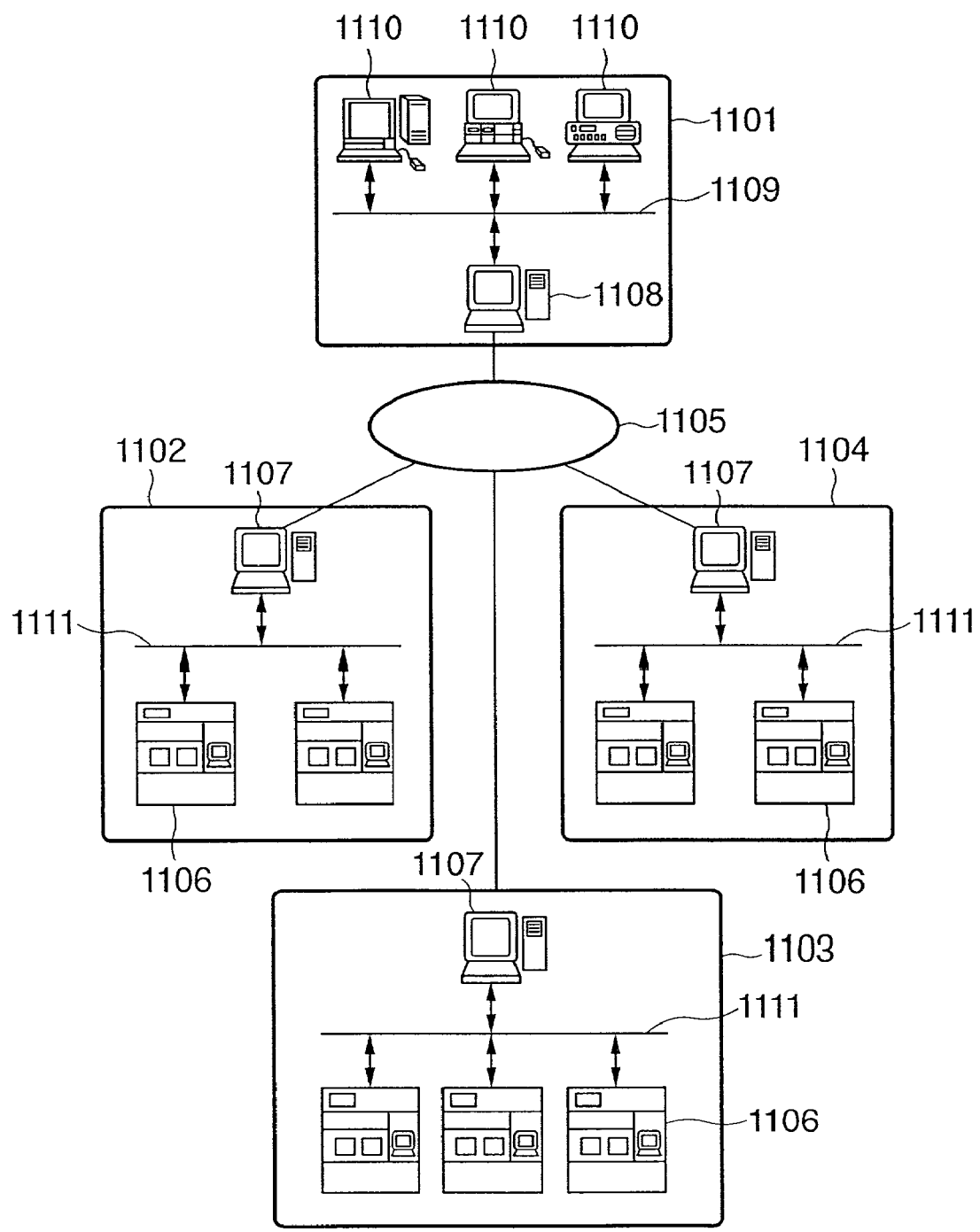
FIG. 6 is an illustration of a semiconductor device manufacturing system using the apparatus according to the present invention, seen from a certain angle.

FIG. 6 expresses the entire system seen from a certain angle. Referring to FIG. 6, reference numeral 1101 denotes a business office of a vendor (e.g., an apparatus supplier), which provides a semiconductor device manufacturing apparatus. An example of the manufacturing apparatus includes, e.g., semiconductor manufacturing apparatuses for performing various types of processes used in a semiconductor manufacturing factory, e.g., a pre-process device, (e.g., a lithography apparatus, such as an exposure apparatus, a resist processing apparatus, and an etching apparatus, a heat-treating apparatus, a film forming apparatus, a planarizing apparatus, and the like) or a post-processing device (e.g., an assembling apparatus, an inspection apparatus, and the like). The business office 1101 has a host management system 1108 for providing a maintenance database for the manufacturing apparatus, a plurality of operation terminal computers 1110, and a local area network (LAN) 1109, which connects the host management system 1108 and operation terminal computers 1110 to make up an intranet, or the like. The host management system 1108 has a gateway for connecting the LAN 1109 to the Internet 1105 as a network outside the business office, and a security function of limiting an external access.

Reference numerals 1102 to 1104 denote manufacturing factories of the semiconductor manufacturer as the user of the manufacturing apparatus. The manufacturing factories 1102 to 1104 may be factories belonging to different manufacturers, or factories (for example, a pre-processing factory, a post-processing factory, and the like) belonging to one manufacturer. Each of the factories 1102 to 1104 has a plurality of manufacturing apparatuses 1106, a local area network (LAN) 111 for connecting the manufacturing apparatuses 1106 to make up an intranet, or the like, and a host management system 1107 serving as a monitoring unit for monitoring the operating states of the respective manufacturing apparatuses 1106. The host management system 1107 provided in each of the factories 1102 to 1104 has a gateway for connecting the LAN 1111 in each factory to the Internet 1105 as a network outside the factory. Thus, the LAN 1111 of each factory can access the host management system 1108 of the vendor 1101 through the Internet 1105. Access by only those uses limited by the security function of the host management system 1108 is allowed. More specifically, the factory informs the vendor of status information (e.g., the symptom of a manufacturing apparatus with trouble) indicating the operating state of each manufacturing apparatus 1106. The factory can receive response information (e.g., information designating a remedy against trouble, or remedy software or data) regarding this notice, and maintenance information, such as update software or help information, from the vendor. Data communication between the factories 1102 and 1104 and the vendor 1101, and that in the LANs 1111 of the respective factories, are done using a communication protocol (TCP/IP) generally used in the Internet. In place of utilizing the Internet as a network outside the factory, a high-security dedicated line network (e.g., an ISDN) that does not allow access by a third party may be utilized. The host management system is not limited to one provided by the vendor. The user may create a database and place it on an external network, and the plurality of factories of the user may be allowed to access the database.

Figure 7:
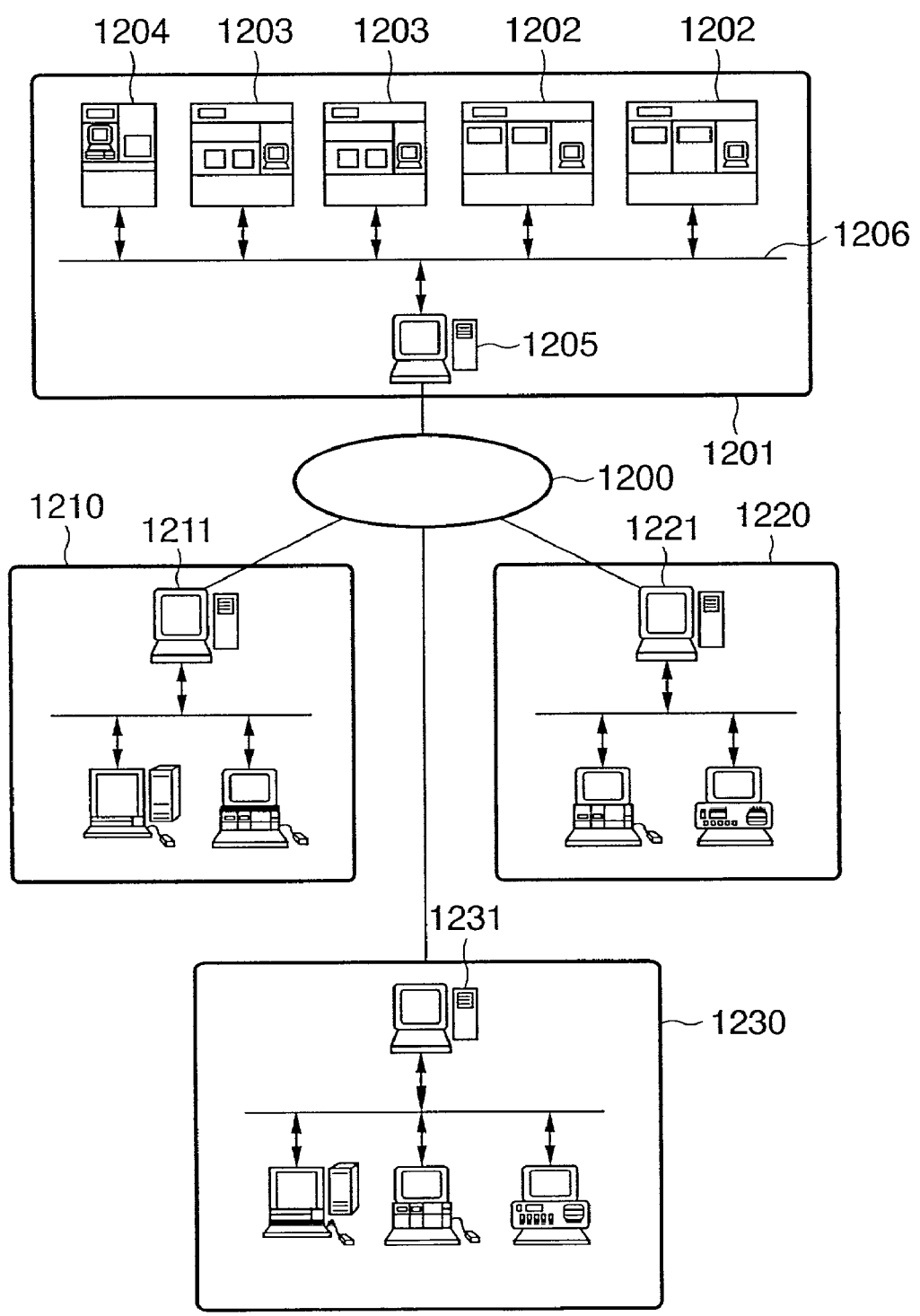
FIG. 7 is an illustration of the semiconductor device manufacturing system using the apparatus according to the present invention seen from another angle.

FIG. 7 is an illustration expressing the entire system of this embodiment seen from an angle different from that of FIG. 6. In the aforementioned example, the plurality of user factories each having the manufacturing apparatuses, and the management system of the vendor of the manufacturing apparatuses are connected to each other through an external network. Information on production management of each factory and at least one manufacturing apparatus are data-communicated through the external network. In contrast to this, in this example, factories each having manufacturing apparatuses of a plurality of vendors, and the management systems of the respective vendors of the plurality of manufacturing apparatuses are connected to each other through an external network outside the factories. The maintenance information on the respective manufacturing apparatuses are data-communicated through the external network. Referring to FIG. 7, reference numeral 1201 denotes a manufacturing factory of a manufacturing apparatus used (e.g., a semiconductor device manufacturer). Manufacturing apparatuses for performing various types of processes, e.g., an exposure apparatus 1202, a resist processing apparatus 1203, and a film formation processing apparatus 1204, are introduced to the manufacturing line of the factory. Although only one manufacturing factory 1201 is illustrated in FIG. 7, in fact, a plurality of factories form a network in this manner. The apparatuses of each factory are connected to each other through a LAN 1206 to make up an intranet. A host management system 1205 performs the operation management of the manufacturing line.

Each business office of the vendors (e.g., apparatus suppliers), e.g., an exposure apparatus manufacturer 1210, a resist processing apparatus manufacturer 1220, or a film formation apparatus manufacturer 1230, has a host management system 1211, 1221, or 1231 for remote-control maintenance of the devices that the users supplied. The host management system has a maintenance database and a gateway to an external network, as described above. The host management system 1205 for managing the respective apparatuses in the manufacturing factory of the user and the management systems 1211, 1221, and 1231 of the vendors of the respective apparatuses are connected to each other through the Internet as an external network 1200, or a private line network. In this system, when trouble occurs in any one of a series of manufacturing devices of the manufacturing line, the manufacturing line stops operation. However, this situation can be quickly coped with by receiving remote-control maintenance from the vendor of the device where the trouble occurs through the Internet 1200. Downtime of the manufacturing can thus be minimized.

Each manufacturing apparatus set in the semiconductor manufacturing factory has a display, a network interface, and a computer for performing network access software and apparatus operating software stored in a storage. For example, the storage is a stored memory, a hard disk, or a network file server. The network access software includes a dedicated or general web browser, and provides a user interface, an example of which is shown in, e.g., FIG. 8, on the display. The operator who manages the manufacturing apparatus in each factory inputs information, such as the type of manufacturing apparatus 1401, serial number 1402, subject of trouble 1403, occurrence date 1404, degree of urgency 1405, symptom 1406, remedy 1407, progress 1408, and the like, in the enter boxes on the display. The input information is transmitted to the maintenance database through the Internet. Appropriate maintenance information corresponding to the transmitted information is sent back from the maintenance database and shown on the display. The user interface provided by the web browser realizes hyperlink functions 1410 to 1412, as shown in FIG. 8. Thus, the operator can access further detailed information of each item, and download updated software to be used for the manufacturing apparatus or operation guide (help information) for reference by the factory operator from the software library of the vendor. The maintenance information provided by the maintenance database also includes information concerning the present invention described above. The software library also provides updated software that realizes the present invention.

Figure 9:
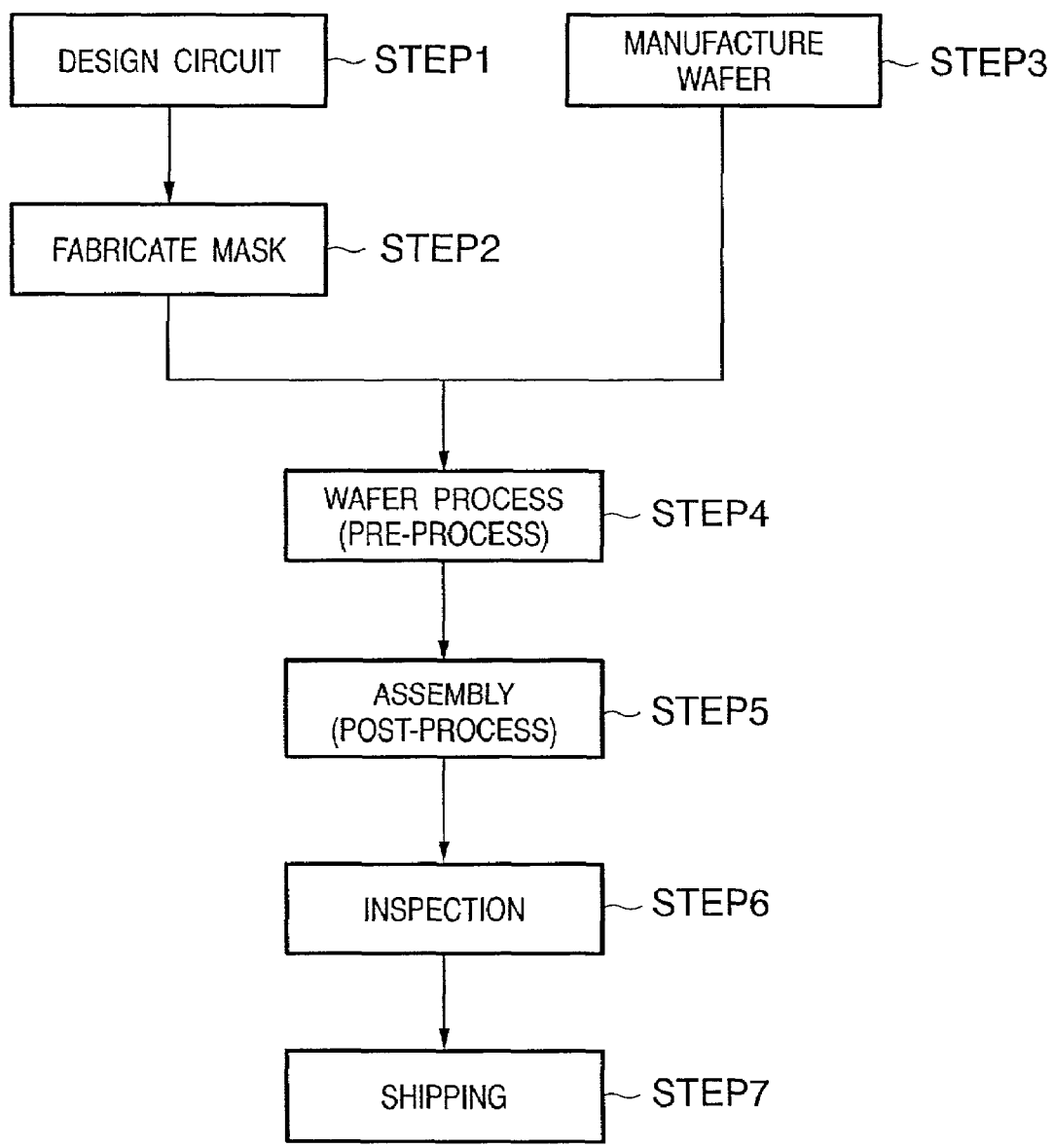
FIG. 9 is a flow chart for describing the flow of a device manufacturing process.

A semiconductor device manufacturing process utilizing the above manufacturing system will now be described. FIG. 9 shows the flow of an overall semiconductor device manufacturing process. In step 1 (design circuit), a semiconductor device circuit is designed. In step 2 (fabricate mask), a mask on which the designed circuit pattern is formed is fabricated. In step 3 (manufacture wafer), a wafer is manufactured by using a material such as silicon. In step 4 (wafer process), called a pre-process, an actual circuit is formed on the wafer by lithography using the prepared mask and wafer. In step 5 (assembly), called a post-process, a semiconductor chip is formed by using the wafer fabricated in step 4, and includes processes such as an assembly process (dicing and bonding) and a packaging process (chip encapsulation). In step 6 (inspection), inspections, such as an operation confirmation test and a durability test of the semiconductor device manufactured in step 5, are conducted. After these steps, the semiconductor device is completed, and shipped (step 7). The pre-process and post-process are performed at different dedicated factories, and maintenance for these processes is performed in units of factories by the remote-control maintenance system described above. Information on manufacture management and apparatus maintenance is data-communicated between the pre-process factory and post-process factory through the Internet or private line network.

Figure 10:
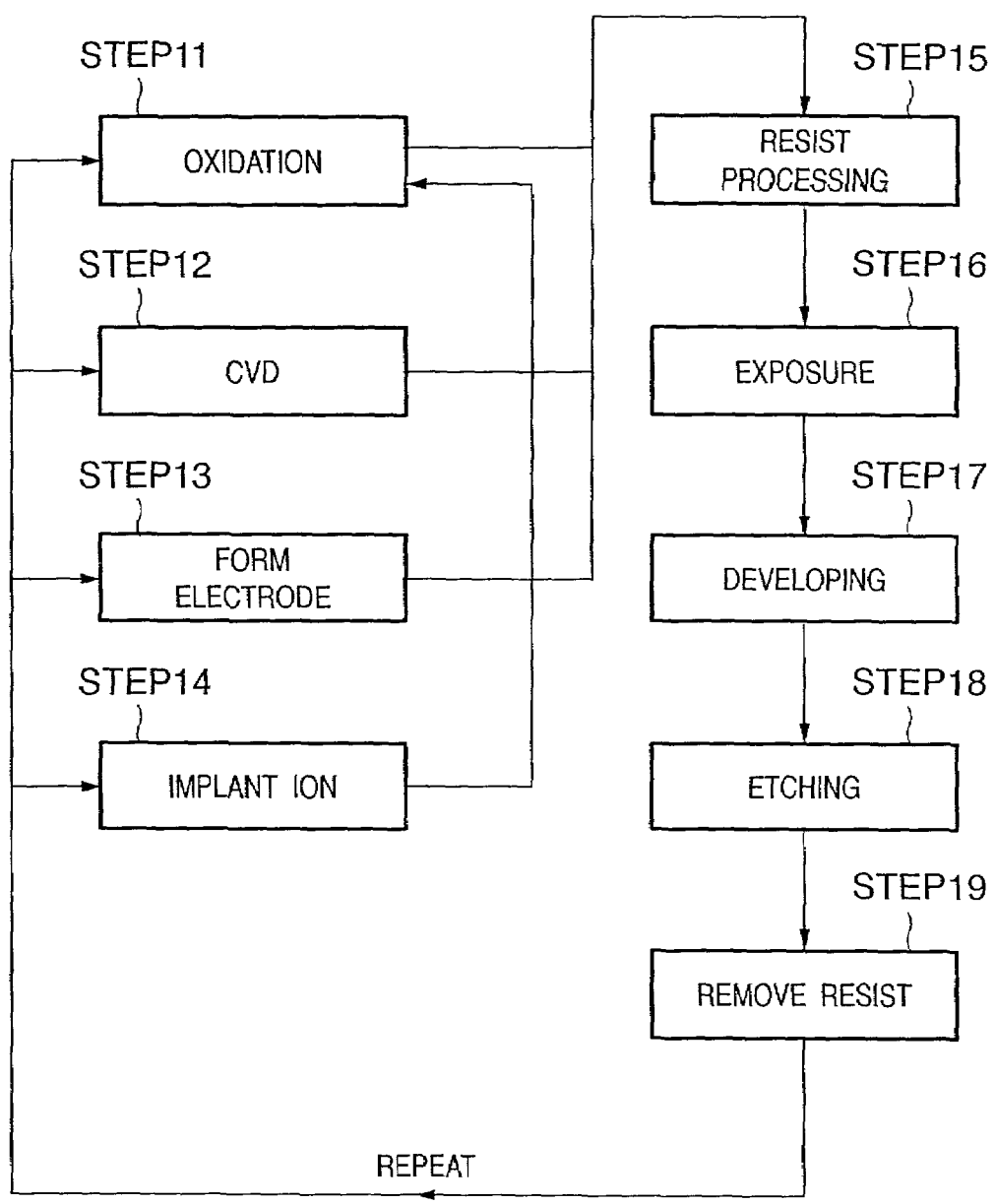
FIG. 10 is a flow chart for describing the wafer process.

FIG. 10 shows the detailed flow of the wafer process. In step 11 (oxidation), the surface of the wafer is oxidized. In step 12 (CVD), an insulating film is formed on the wafer surface. In step 13 (form electrode), an electrode is formed on the wafer by vapor deposition. In step 14 (implant ion), ions are implanted in the wafer. In step 15 (resist processing), a photosensitive agent is applied to the wafer. In step 16 (exposure), the above-mentioned exposure apparatus exposes the circuit pattern of the mask to the wafer. In step 17 (developing), the exposed wafer is developed. In step 18 (etching), the resist is etched except for the developed resist image. In step 19 (remove resist), any unnecessary resist after etching is removed. These steps are repeated to form multiple circuit patterns on the wafer. As the maintenance of the manufacturing devices used in the respective steps is performed by the remote-control maintenance system described above, trouble is prevented. Even if trouble should occur, it can be coped with, and the normal operating condition is restored quickly. The semiconductor device productivity can thus be improved to be higher than that in the prior art.

As described above, with the moving/guiding apparatus according to this embodiment, the first and second movable bodies (41 and 42) are guided horizontally and vertically by the guides fixed on the surface plate (11). The third movable body (3) is guided in the vertical direction by the surface of the surface plate (11), and is guided in the horizontal direction by the side surfaces of the first and second movable bodies. The first to third movable bodies are accommodated in the vacuum container (8). The first and second movable bodies are driven by actuators fixed outside the vacuum container. The driving operation of the third movable body is transmitted through the horizontal guide operations of the first and second movable bodies.

Preferably, the first movable body is guided in one side by the guide (21, 611) fixed on the surface plate and restrained in vertical and horizontal directions entirely, and is guided in the other side by the stationary guide (211, 612) restrained only in the vertical direction. Similarly, the second movable body is guided in one side by the guide (22, 621) fixed on the surface plate and restrained in vertical and horizontal directions entirely, and is guided in the other side by the stationary guide (221, 622) restrained only in the vertical direction. Hence, the present invention has the following effects.

(1) The height can be decreased when compared to a structure in which X and Y stages are stacked.

(2) Since a mechanism such as a coupling is not used, even when the position of the third movable body changes, the dynamic characteristics do not change, and a high controllability is obtained.

(3) Even when the third movable body moves, no eccentric load is generated, and the static posture precision can be maintained at high precision.

Since the first to third movable bodies are guided through the static pressure bearings, the following effects are obtained.

(4) Concerning vibration, it is transmitted only through the gap of the static pressure bearing. Thus, the transmitted amount of vibration is very small, so the posture precision can be maintained dynamically at high precision.

(5) Since the first and second movable bodies are driven by the two linear motors on the surface plate (12), yawing vibration can be suppressed, and the dynamic posture precision can be maintained at high precision.

(6) Since no friction exists, hissing, or the like, does not occur, and high-precision positioning can be performed.

(7) Since heat generation by a contact portion does not occur, thermal deformation, or the like, does not occur. This also enables high-precision positioning.

(8) Since no dust is generated, a mechanism for collecting dust is unnecessary, leading to a simple arrangement and cost reduction.

(9) Maintenance, such as grease up, is not necessary.

The overall structure of the guiding apparatus described above can provide the following effects.

(10) The first and second movable bodies are guided in the horizontal direction by the side surfaces of the stationary guides on the surface plate. Even when a temperature change occurs, the gap of the bearing does not change, and the frequency characteristics do not change. Also, damage by transportation, or the like, does not occur.

(11) Since a driving operation is performed from outside the vacuum container, the vacuum container can be downsized.

(12) The vacuum seal portion is of a no-contact type as well. This also enables high-precision positioning.

As many apparently widely different embodiments of the present invention can be made without departing from the spirit and scope thereof, it is to be understood that the invention is not limited to the specific embodiments thereof except as defined in the appended claims.

What is claimed is:

1. A moving/guiding apparatus comprising:
a first movable body and a second movable body guided to move in intersecting directions, arranged at vertically different positions, and restrained in a vertical direction;
first and second actuators for driving said first and second movable bodies in the intersecting directions;
a third movable body guided to be movable on a surface plate in a moving direction of said first movable body and in a moving direction of said second movable body, and driven in two intersecting directions upon reception of forces from guide surfaces in a horizontal direction of said first and second movable bodies;
first and second radial bearings for guiding one side of said first movable body and one side of said second movable body, respectively, and restraining said first and second movable bodies, respectively, in all directions, except for the movable direction; and
third and fourth bearings for guiding the other side of said first movable body and the other side of said second movable body, respectively, and restraining said first and second movable bodies in the vertical direction.

2. The apparatus according to claim 1, further comprising a vacuum container for accommodating said first, second and third movable bodies, wherein said first and second actuators are set outside said vacuum container.

3. The apparatus according to claim 2, further comprising:
a rigid body for transmitting driving forces from said first and second actuators to said first and second movable bodies, and
a seal for sealing said rigid body and said vacuum container with a labyrinth seal structure.

4. The apparatus according to claim 1, further comprising a static pressure bearing for guiding said first, second, and third movable bodies.

5. The apparatus according to claim 1, wherein said first and second actuators are ultrasonic linear motors.

6. The apparatus according to claim 1, wherein
said first actuator includes a pair of linear motors for transmitting driving forces to two sides of said first movable body, and
said second actuator includes a pair of linear motors for transmitting driving forces to two sides of said second movable body.

7. An exposure apparatus that uses the moving/guiding apparatus according to claim 1 in an exposure operation.

8. A semiconductor device manufacturing method comprising the steps of:
setting a group of manufacturing apparatuses, including the exposure apparatus according to claim 7, for performing respective types of processes, in a semiconductor manufacturing factory; and
manufacturing a semiconductor device in accordance with a plurality of processes performed by using the group of manufacturing apparatuses.

* * * * *